United States Patent
Yu et al.

(10) Patent No.: US 7,916,485 B2
(45) Date of Patent: Mar. 29, 2011

(54) FIN-TYPE HEAT SINK AND ELECTRONIC DEVICE USING SAME

(75) Inventors: Fang-Xiang Yu, Shenzhen (CN); Jer-Haur Kuo, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 27 days.

(21) Appl. No.: 12/490,278

(22) Filed: Jun. 23, 2009

(65) Prior Publication Data

US 2010/0157537 A1 Jun. 24, 2010

(30) Foreign Application Priority Data

Dec. 22, 2008 (CN) .......................... 2008 1 0306413

(51) Int. Cl.
*H05K 7/20* (2006.01)

(52) U.S. Cl. ........ 361/710; 361/700; 361/704; 361/707; 165/80.3; 165/104.26

(58) Field of Classification Search .................. 361/700, 361/704, 707, 709, 710, 718, 719

See application file for complete search history.

(56) References Cited

U.S. PATENT DOCUMENTS

| | | | | |
|---|---|---|---|---|
| 6,082,439 A | * | 7/2000 | Kato et al. ....................... | 165/79 |
| 6,293,333 B1 | * | 9/2001 | Ponnappan et al. ..... | 165/104.26 |
| 6,311,510 B1 | * | 11/2001 | Sunama et al. ................. | 62/268 |
| 6,725,910 B2 | * | 4/2004 | Ishida et al. ............. | 165/104.26 |
| 7,518,868 B2 | * | 4/2009 | Farrow et al. ................. | 361/700 |
| 7,551,442 B2 | * | 6/2009 | Stefanoski .................... | 361/700 |
| 2004/0052052 A1 | * | 3/2004 | Rivera .......................... | 361/700 |
| 2005/0269069 A1 | * | 12/2005 | Hancock ....................... | 165/179 |
| 2006/0164809 A1 | * | 7/2006 | Yu et al. ........................ | 361/704 |
| 2007/0053168 A1 | * | 3/2007 | Sayir et al. .................... | 361/718 |
| 2009/0229801 A1 | * | 9/2009 | Stewart ......................... | 165/151 |
| 2010/0157540 A1 | * | 6/2010 | Yu et al. ........................ | 361/710 |

* cited by examiner

*Primary Examiner* — Jayprakash N Gandhi
*Assistant Examiner* — Courtney Smith
(74) *Attorney, Agent, or Firm* — Frank R. Niranjan

(57) ABSTRACT

A heat sink includes two heat spreaders spaced from each other and a heat dissipation fin disposed and connected between the two heat spreaders. The heat dissipation fin includes a plurality of hollow tubular heat dissipation units arranged linearly from one of the heat spreaders to the other one of the heat spreaders. The heat dissipation units are connected together with their axes along length directions thereof being parallel to each other. Each of the heat dissipation units can resiliently deform to change a distance between the two heat spreaders. The present disclosure also discloses an electronic device incorporating such a heat sink.

6 Claims, 4 Drawing Sheets

FIN-TYPE HEAT SINK AND ELECTRONIC DEVICE USING SAME

BACKGROUND

1. Technical Field

The present disclosure relates to heat sinks, and particularly to a heat sink with flexible heat dissipation fins and having a good adaptability to different electronic devices.

2. Description of Related Art

With continuing development of the electronic technology, electronic components such as CPUs (central processing units) generate more and more heat required to be dissipated immediately. Conventionally, heat sinks are used to remove the heat generated by the electronic components.

A typical heat sink includes a base and a plurality of heat dissipation fins extending upwardly and perpendicularly from the base. The heat dissipation fins are flat-shaped and rigid. A size of the heat sink can not be changed in use unless be destroyed. However, different electronic devices usually have different shapes and sizes, and thus a space of each electronic device for accommodating the heat sink is different from that of other electronic devices. Therefore, the heat sink with a changeless size can only be used in one special electronic device, which causes an inferior adaptability to the heat sink.

For the said reasons, a heat sink which can overcome the described shortcomings is desired.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
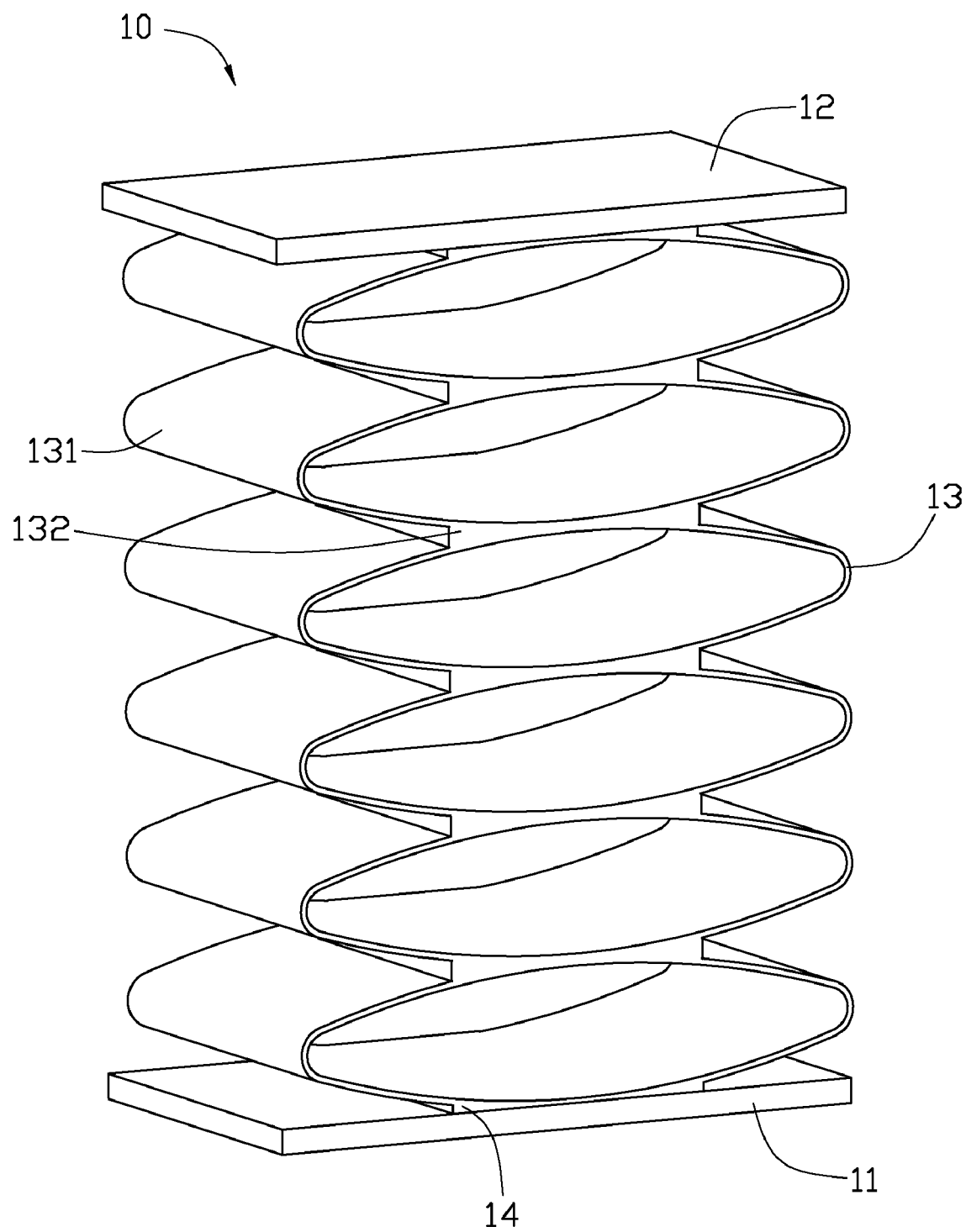
FIG. 1 is an isometric view of a heat sink according to a first embodiment of the present disclosure.

Referring to FIG. 1, a heat sink 10 according to a first embodiment of the present disclosure includes a first heat spreader 11, a second heat spreader 12 spaced from the first heat spreader 11, and a heat dissipation fin 13 disposed and connected between the first and second heat spreaders 11, 12. The first and second heat spreaders 11, 12 are made of thermal conductive materials, such as copper, aluminum, etc. The heat dissipation fin 13 is made of thermal conductive and pliable material, such as aluminum or aluminum alloy.

Each of the heat spreaders 11, 12 is substantially a rectangular plate. The first heat spreader 11 faces to and is parallel to the second heat spreader 12.

The heat dissipation fin 13 includes a plurality of hollow tubular heat dissipation units 131 arranged linearly from the first heat spreaders 11 to the second heat spreaders 12. An axis of each heat dissipation unit 131 is parallel to the heat spreaders 11, 12. A cross section of each heat dissipation unit 131 taken along a direction perpendicular to the axis of the heat dissipation unit 131 has a shape of an ellipse which has a minor axis $\phi_1$ perpendicular to the first and second spreaders 11, 12, and a major axis $\phi_2$ parallel to the firs and second spreaders 11, 12 (referring to FIG. 2). The heat dissipation units 131 are arranged along the minor axis $\phi_1$ of the ellipse. Every two neighboring heat dissipation units 131 are connected together by a connecting portion 132 between them. The connecting portion 132 enables a surface to surface connection between every two neighboring heat dissipation units 131 and thus enlarges a contacting area of the two neighboring heat dissipation units 131. Two heat dissipation units 131 at topmost and bottommost ends of the heat dissipation fin 13 are respectively connected to the first and second heat spreaders 11, 12 via two securing portions 14. The securing portions 14 enlarge contacting areas between the outmost two heat dissipation units 131 and the two heat spreaders 11, 12. Preferably, the topmost and bottommost heat dissipation units 131 of the heat dissipation fin 13 are welded on the first and second heat spreaders 11, 12, respectively. Alternatively, the heat spreaders 11, 12 can also be integrally formed with the heat dissipation fins 13. Each of the heat dissipation units 131 can resiliently deform in a direction perpendicular to the major axis $\phi_2$ thereof. In other words, each of the heat dissipation units 131 can resiliently deform in a direction along the minor axis $\phi_1$ thereof Thus, when a force is applied to the two heat spreaders 11, 12 of the heat sink 10, the heat dissipation fin 13 will be stretched or compressed resiliently to change a distance between the first heat spreader 11 and the second heat spreaders 12.

Figure 2:
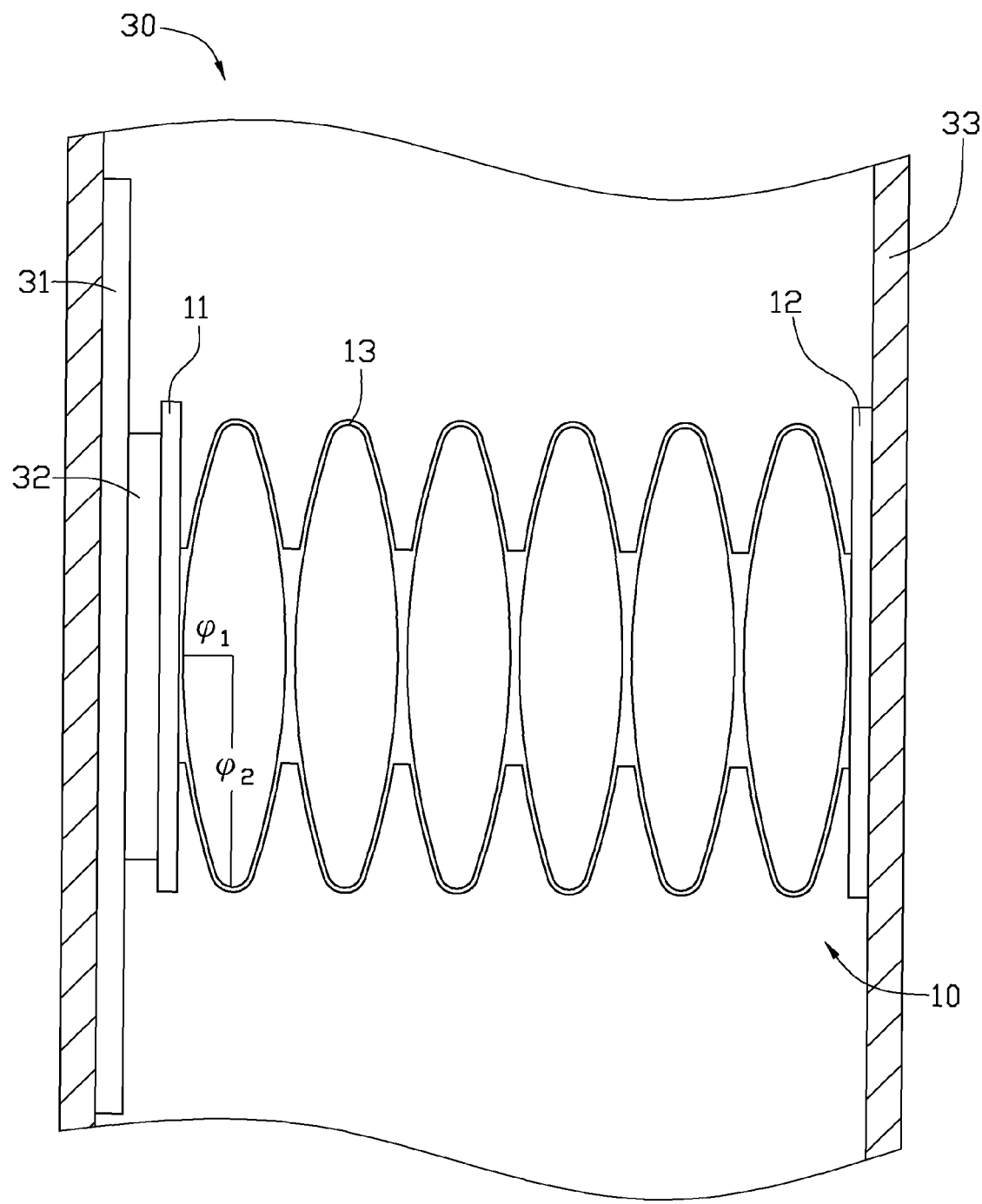
FIG. 2 is a schematic view of an electronic device incorporating the heat sink of FIG. 1.

Referring to FIG. 2, an electronic device 30 incorporating the heat sink 10 is shown. The electronic device 30 may be a computer, a projector, etc. The electronic device 30 includes a shell 33, a printed circuit board 31 secured on an inner surface of the shell 33, and an electronic component 32 such as a CPU mounted on the printed circuit board 31. The electronic component 32 generates heat during operation. The heat sink 10 is received in the shell 33 and secured on the electronic component 32. The first heat spreader 11 of the heat sink 10 is attached to the electronic component 32 and acts as a heat absorber to absorb the heat thereof. In this embodiment, the inner space of the shell 33 is narrow, with a height being a little smaller than that of the heat sink 10 at a free state. Since the heat dissipation fins 13 can be resiliently compressed, the heat sink 10 is compressed along a direction perpendicular to the heat spreaders 11, 12 to reduce the height of the heat sink 10, and thus the heat sink 10 can be mounted into the narrow inner space of the electronic device 30. The second heat spreader 12 is resiliently pushed by the compressed heat dissipation fins 13 to abut against an inner surface of the shell 33 at a side opposite to the printed circuit board 31. Thus, when the heat of the electronic component 32 is transferred to the heat dissipation fins 13 through the first heat spreader 11, the heat of the heat dissipation fins 13 can be transferred to the shell 33 though the second heat spreader 12 and then dissipate to ambient air directly via the shell 33, which enables the shell 33 to function as a radiator for heat dissipation.

Contrarily, if the inner space of the shell 33 is larger than the height of the heat sink 10, the heat sink 10 should be stretched along the direction perpendicular to the heat spreaders 11, 12 to increase the height of the heat sink 10. In this situation, fastening means such as screws, adhesive, clip, etc is required to securely attach the first heat spreader 11 to the electronic component 32 and the second heat spreader 12 to the shell 33. Thus, the second heat spreader 12 can abut the inner surface of the shell 33 for enhancing heat dissipation efficiency of the heat sink 10.

Moreover, the heat sink 10 connected between the shell 33 and the printed circuit board 31 can deform to act as a buffer to reduce an impact of force on the electronic component 32 when the electronic device 30 is subject to an unexpected external force or a vibration, thus to protect the electronic component 32 from a possible damage.

Figure 3:
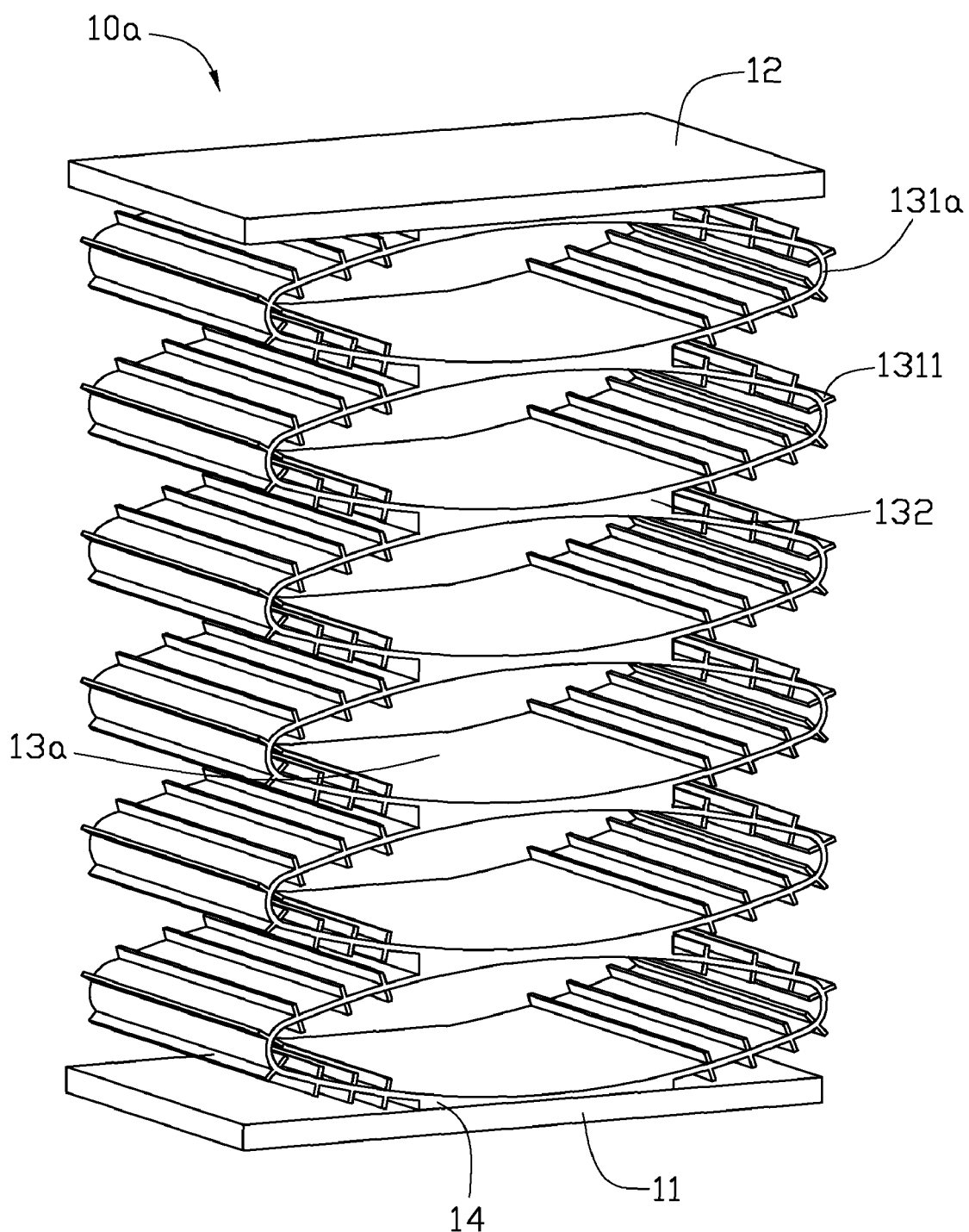
FIG. 3 is an isometric view of a heat sink according to a second embodiment of the present disclosure.

FIG. 3 shows a heat sink 10a according to a second embodiment of the present disclosure. Similar to the heat sink 10 in the first embodiment, the heat sink 10a includes two heat spreaders 11, 12 spaced from each other and a heat dissipation fin 13a disposed between the two heat spreaders 11, 12. The heat dissipation fin 13a includes a plurality of hollow and tubular heat dissipation units 131a arranged linearly between the heat spreaders 11, 12. The difference between this embodiment and the previous embodiment is that the heat dissipation fin 13a has a plurality of projections 1311 formed on each of the heat dissipation units 131a. The projections 1311 are teeth-shaped on inner and outer peripheries of each of the heat dissipation units 131a and extend along a front-to-rear direction thereof. The projections 1311 are parallel to and evenly spaced from each other for increasing a heat dissipation area of the heat dissipation fin 13a. A length of the projection 1311 is equal to that of each of the heat dissipation units 131a along the front-to-rear direction thereof (i.e., a length direction of the heat dissipation unit 131a).

Figure 4:
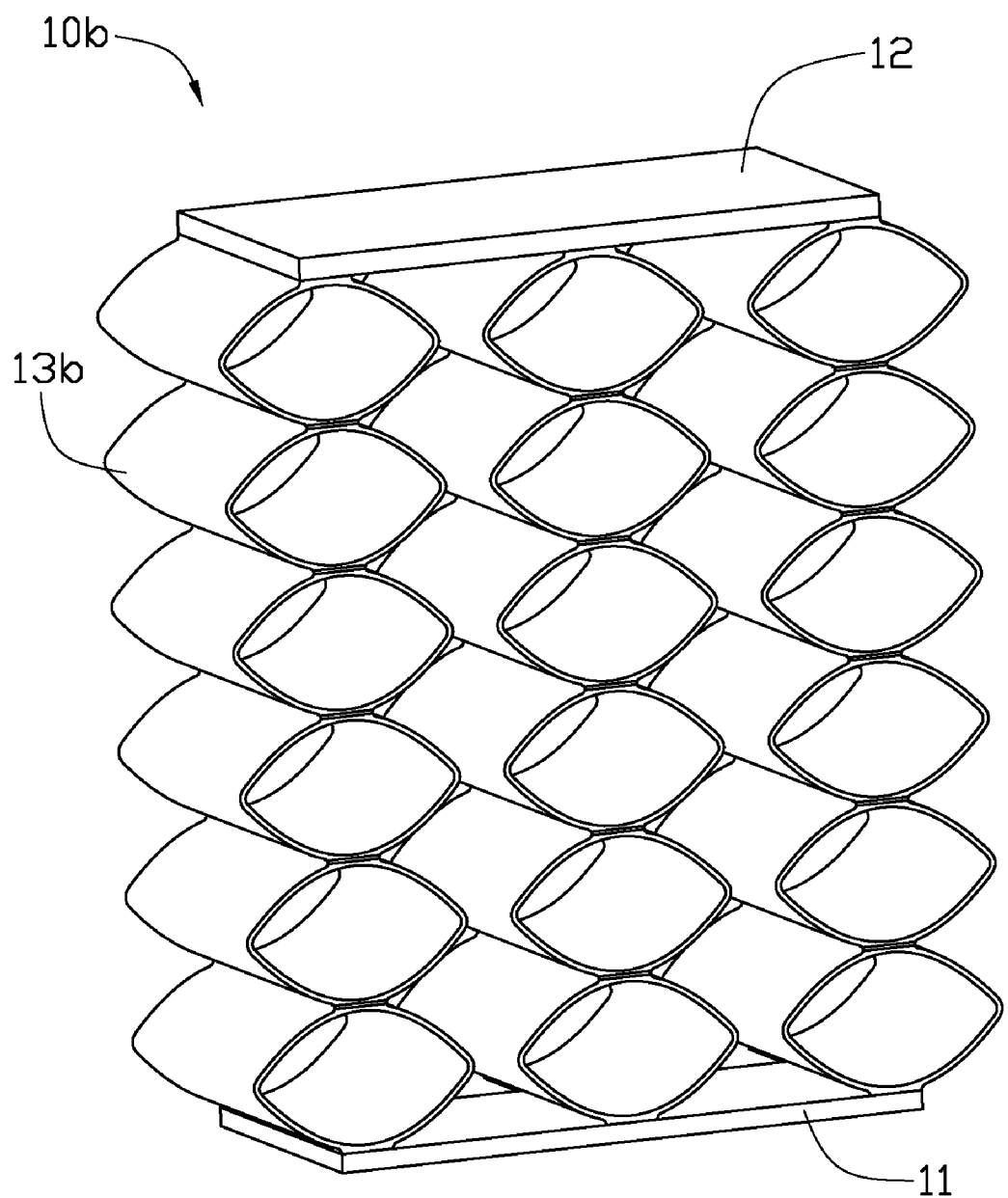
FIG. 4 is an isometric view of a heat sink according to a third embodiment of the present disclosure.

FIG. 4 shows a heat sink 10b according to the third embodiment of the present disclosure, differing from the previous heat sink 10 in that the heat sink 10b has three heat dissipation fins 13b connected between the heat spreaders 11, 12, wherein the three heat dissipation fins 13b are parallel to each other. The three heat dissipation fins 13b are spaced from each other a sufficient distance, to thereby avoid an impact and an interference between every two neighboring heat dissipation fins 13b when the heat dissipation fins 13b are compressed.

It is to be understood that even though numerous characteristics and advantages of the disclosure have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electronic device comprising:
a shell;
an electronic component mounted in the shell; and
a heat sink received in the shell and mounted on the electronic component to absorb heat therefrom, the heat sink comprising at least one heat dissipation fin disposed between the electronic component and the shell, the at least one heat dissipation fin comprising a plurality of hollow tubular heat dissipation units arranged linearly and being connected together with their axes along length directions thereof being parallel to each other;
wherein each of the heat dissipation units can resiliently deform to change a height of the heat sink in a direction along which the heat dissipation units are arranged linearly;
wherein a cross section of each of the heat dissipation units taken along a direction perpendicular to the axis thereof has a shape of an ellipse, and the heat dissipation units are arranged linearly along a minor axis of the ellipse; and
wherein the heat sink further comprises two heat spreaders spaced from each other and respectively connected to outmost two of the heat dissipation units of the at least one heat dissipation fin though two securing portions, one of the heat spreaders being attached to the electronic component, and the other one of the heat spreaders being attached to the shell.

2. The electronic device of claim 1, wherein every two neighboring ones of the heat dissipation units are connected together by a connecting portion between them, the connecting potion enabling a surface to surface connection between the every two neighboring ones of the heat dissipation units.

3. The electronic device of claim 1, wherein the heat sink comprises a plurality of heat dissipation fins spaced from each other, and the heat dissipation fins are parallel to each other.

4. The electronic device of claim 1, wherein the at least one heat dissipation fin has a plurality of projections formed on inner and outer surfaces of each heat dissipation unit, the projections being teeth-shaped and spaced from each other, each projection extending along the length direction of a corresponding one of the heat dissipation units.

5. The electronic device of claim 1, wherein the heat dissipation fin is made of thermal conductive and pliable material.

6. The electronic device of claim 2, wherein the at least one heat dissipation fin is made of aluminum or aluminum alloy, and is integrally formed with the two heat spreaders.

* * * * *